United States Patent
Tour et al.

(10) Patent No.: US 7,838,077 B2
(45) Date of Patent: *Nov. 23, 2010

(54) FUNCTIONALIZED, HYDROGEN-PASSIVATED SILICON SURFACES

(75) Inventors: James M. Tour, Bellaire, TX (US); Michael P. Stewart, San Francisco, CA (US)

(73) Assignee: William Marsh Rice University, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/407,471

(22) Filed: Mar. 19, 2009

(65) Prior Publication Data

US 2009/0269593 A1 Oct. 29, 2009

Related U.S. Application Data

(63) Continuation of application No. 11/619,073, filed on Jan. 2, 2007, now Pat. No. 7,527,831, which is a continuation of application No. 10/356,841, filed on Feb. 3, 2003, now Pat. No. 7,176,146.

(60) Provisional application No. 60/353,120, filed on Feb. 1, 2002.

(51) Int. Cl.
 *B05D 3/00* (2006.01)
(52) U.S. Cl. .................................... 427/399
(58) Field of Classification Search .............. None
See application file for complete search history.

(56) References Cited

U.S. PATENT DOCUMENTS

| 5,429,708 | A | 7/1995 | Linford et al. |
| 5,554,739 | A | 9/1996 | Belmont |
| 6,042,643 | A | 3/2000 | Belmont et al. |
| 6,217,740 | B1 | 4/2001 | Andrieux et al. |
| 6,284,317 | B1 | 9/2001 | Laibinis et al. |
| 6,368,239 | B1 | 4/2002 | Devenport et al. |
| 6,430,511 | B1 | 8/2002 | Tour et al. |
| 6,827,979 | B2 | 12/2004 | Mirkin et al. |
| 6,986,943 | B1 * | 1/2006 | Cook et al. ............ 428/402 |
| 7,112,366 | B2 | 9/2006 | McCreery et al. |
| 2003/0058697 | A1 | 3/2003 | Tour et al. |
| 2008/0236666 | A1 * | 10/2008 | Bidan et al. ............. 136/261 |

FOREIGN PATENT DOCUMENTS

| WO | 02/060812 | 8/2002 |
| WO | 03/032330 | 4/2003 |

OTHER PUBLICATIONS

Cahen, et al., "Molecules and Electronic Materials", Adv. Mater., 14 (2002), pp. 789-798.

(Continued)

*Primary Examiner*—Erma Cameron
(74) *Attorney, Agent, or Firm*—Winstead PC

(57) ABSTRACT

This invention is generally related to a method of making a molecule-surface interface comprising at least one surface comprising at least one material and at least one organic group wherein the organic group is adjoined to the surface and the method comprises contacting at least one organic group precursor with at least one surface wherein the organic group precursor is capable of reacting with the surface in a manner sufficient to adjoin the organic group and the surface.

21 Claims, 1 Drawing Sheet

OTHER PUBLICATIONS

Yaliraki, et al., "Interplay of Topology and Chemical Stability on the Electronic Transport of Molecular Junctions", Ann. N.Y. Acad. Sci., 960 (2002), pp. 153-162.

Ulman, "Formation and Structure of Self-Assembled Monolayers", Chem. Rev., 96 (1996), pp. 1533-1554.

Buriak, "Organometallic Chemistry on Silicon and Germanium Surfaces", Chem. Rev., 102 (2002), pp. 1271-1308.

Seker, et al., "Surface Chemistry of Prototypical Bulk II-VI and III-V Semiconductors and Implications for Chemical Sensing", Chem. Rev., 100 (2000), pp. 2505-2536.

Chen, et al., "Large On-Off Ratios and Negative Differential Resistance in a Molecular Electronic Device", 286 (1999), pp. 1550-1552.

Tour, "Molecular Electronics. Synthesis and Testing of Components", Acc. Chem. Res., 33 (2000), pp. 791-804.

Reed, et al., "Molecular random access memory cell", App. Phys. Lett., 78 (2001), pp. 3735-3739.

Villeneuve, et al., "Electrochemical Formation of Close-Packed Phenyl Layers on Si(111)", J. Phys. Chem. B, 101 (1997), pp. 2415-2420

Combellas, et al., "Surface modification of halogenated polymers. 4. Functionalisation of poly(tetrafluoroethylene) surfaces by diazonium salts", Polymer, 44 (2003), pp. 19-24.

Wade, et al., "Preparation of Pit-Free Hydrogen-Terminated Si(111) in Deoxygenated Ammonium Fluoride", Mat. Res. Soc. Symp. Proc., 477 (1997), pp. 299-304.

Higashi, et al., "Ideal hydrogen termination of the Si(111) surface", Appl. Phys. Lett., 56 (1990), pp. 656-658.

Schmid, et al., "Current and Future Applications of Nanoclusters", Chem. Soc. Rev., (1999), pp. 179-185.

Parikh, et al., "Quantitative determination of molecular structure in multilayered thin films of biaxial and lower symmetry from photon spectroscopies. I. Reflection infrared vibrational spectroscopy", J. Chem. Phys., 96 (1992), pp. 927-945.

Tour, et al., "Synthesis and Preliminary Testing of Molecular Wires and Devices", Chem. Eur. J., 7 (2001), pp. 5118-5134.

Kosynkin, et al., "Phenylene Ethynylene Diazonium Salts as Potential Self-Assembling Molecular Devices", 3 (2001), pp. 993-995.

* cited by examiner

FUNCTIONALIZED, HYDROGEN-PASSIVATED SILICON SURFACES

CROSS-REFERENCE TO RELATED APPLICATIONS

This application is a continuation of U.S. patent application Ser. No. 11/619,073 (now issued as U.S. Pat. No. 7,527,831), filed Jan. 2, 2007, which is a continuation of U.S. patent application Ser. No. 10/356,841 (now issued as U.S. Pat. No. 7,176,146), filed Feb. 3, 2003, which claims the priority of U.S. provisional patent application 60/353,120, filed Feb. 1, 2002, all of which are incorporated by reference as if written herein in their entirety.

STATEMENT REGARDING FEDERALLY SPONSORED RESEARCH

This work was supported by funding from the Department of Defense Advanced Research Projects Agency (DARPA) administered by the Office of Naval Research (ONR) Grant Nos. N00014-01-1-0657 and N00014-99-1-0406.

FIELD OF THE INVENTION

This invention is generally related to a method of making a molecule-surface interface. The surface comprises at least one material and at least one organic group adjoined to the surface. The method comprises contacting at least one organic group precursor with at least one surface wherein the organic group precursor is capable of reacting with the surface in a manner sufficient to adjoin the organic group and the surface.

BACKGROUND OF THE INVENTION

Modern solid-state electronic devices, such as transistors and other circuits and switches, rely on high-quality, easily manufactured electrical interconnects, where an interconnect comprises a point of contact between at least two different materials. Key to the proper function of such interconnect devices is the robustness of the interconnect and its ability to reliably conduct electronic signals such as current and potential. Additionally, interconnect devices may also be required to conduct photons as for example to transmit light-based signals. Dependable techniques of manufacturing strive to consistently create high-quality, defect-free interconnects. Such devices fail when contact across the interconnect is impeded or prevented. For example, at small dimensions surface roughness at the contact boundary can make it difficult to achieve or maintain contact sufficient to ensure proper electrical conduction. At dimensions approaching the nanometer scale, normal surface topology of metal surfaces ordinarily used in interconnects can prevent large portions of the corresponding surfaces from establishing contact. These gaps substantially increase the electrical resistance in the interconnect device and often result in an interconnect device that cannot adequately conduct electrical current.

Recent advances in nanotechnology have made it possible to consider the smallest possible sizes for electronic devices. Namely, circuits and devices, including electrical interconnects, employing devices that comprise one or a small collection of molecules are now within the realm of plausible device structures. Engineering good contacts at the molecular level poses a significant challenge. As the fabrication of coherent molecular electronic structures on various surfaces evolves, the detailed chemical nature of the connection between the molecular and macro-scale worlds will become increasingly important. See, for example, Cahen, D.; Hodes, G. *Adv. Mater.* 2002, 14, 789 and Yaliraki, S. N.; Ratner, M. A. *Ann. N.Y. Acad. Sci.* 2002, 960, 153.

Ideally, in the case of electronic devices employing conjugated organic molecules, a bond allowing strong electronic coupling between the energy bands of a bulk contact and the orbitals of a conjugated organic molecule would allow for a great deal of synthetic variation in device properties. Recent advances in surface chemistry offer an increasingly sophisticated range of techniques for orienting molecules on a wide variety of materials. See for example, Ullman, A. *Chem. Rev.* 1996, 96, 1533; Buriak, J. M. *Chem. Rev.* 2002, 102, 1271; and Seker, F.; Meeker, K.; Kuech, T. F.; Ellis, A. B. *Chem. Rev.* 2000, 100, 2505. These new techniques improve the prospects of future 'bottom-up' fabrication strategies in nanotechnology using chemical techniques and molecular components to augment traditional fabrication schemes. See, for example, Chen, J.; Reed, M. A.; Rawlett, A. M.; Tour, J. M. *Science* 1999, 286, 1550; Tour, J. M. *Acc. Chem. Res.* 2000, 33, 791; and Reed, M. A.; Chen, J.; Rawlett, A. M.; Price, D. W.; Tour, J. M. *App. Phys. Lett.* 2001, 78, 3735, all incorporated herein by reference.

Some have attempted to functionalize surfaces with organic molecules employing various combinations of conditions and/or reagents.

U.S. Pat. No. 5,429,708 to Linford et al. provides for a method for producing a molecular layer of a selected molecular moiety on a silicon surface in which a silicon surface is etched to form a hydrogenated silicon surface and combined with a free radical-producing compound, where the free radical produced by the free radical-producing compound corresponds to the selected molecular moiety. The combined silicon surface and free radical-producing compound is then heated to sufficient temperature to initiate reaction between the free radical-producing compound and the hydrogenated silicon surface.

U.S. Pat. No. 6,284,317 B1 to Laibinis et al. relates to methods of derivatizing semiconductor surfaces, particularly porous silicon surfaces with silicon-carbon units. The derivatization occurs through the direct addition of an organometallic reagent in the absence of an external energy source such as heat and photochemical or electrochemical energies. The method of the invention allows the formation of unique intermediates including silicon hydride units bonded to metal ions. Because of these unique intermediates, it is possible to form previously inaccessible silicon-carbon units, for example where the carbon atom is an unsaturated carbon atom. Such inaccessible silicon-carbon units also include silicon-polymer covalent bond formation, in particular where the polymer is a conducting polymer. Thus, the present invention also provides a novel semiconductor surface/polymer junction having improved interfacial interactions.

U.S. Pat. No. 6,217,740 B1 to Andrieux et al. concerns a process for electrochemically producing a carbonaceous material with its surface modified by organic groups, in particular functionalized organic groups. The process comprises providing a solution, in a protic or aprotic solvent, comprising a salt of a carboxylate of an organic residue capable of undergoing a Kolbe reaction. The solution is then put in contact with a carbonaceous material, wherein the carbonaceous material is positively polarized with respect to a cathode that is also in contact with the solution. The solution may optionally contain an electrolyte. The invention also concerns carbonaceous materials modified at the surface with arylmethyl groups and the use of these modified materials, for example, in the production of composite materials.

U.S. Pat. No. 5,554,739 to Belmont discloses processes for preparing a carbon product having an organic group attached to a carbon material. The carbon material is selected from graphite powder, a graphite fiber, a carbon fiber, a carbon cloth, a vitreous carbon product, and an activated carbon product. In one process at least one diazonium salt reacts with a carbon material, in the absence of an externally applied electric potential, sufficient to activate the diazonium salt. In another process at least one diazonium salt reacts with a carbon material in a protic reaction medium.

U.S. Pat. No. 6,042,643 to Belmont et al. discloses processes for preparing a carbon black product having an organic group attached to the carbon black. In one process at least one diazonium salt reacts with a carbon black in the absence of an externally applied electric current sufficient to reduce the diazonium salt. In another process at least one diazonium salt reacts with a carbon black in a protic reaction medium. Carbon black products which may be prepared according to process of the invention are described as well as uses of such carbon black products in plastic compositions, rubber compositions, paper compositions, and textile compositions.

PCT Patent Application No. 02/23747 to Tour et al., filed on Jul. 26, 2002 and incorporated herein by reference, describes an electrical interconnect device achieved by applying to the surface of the contact(s) a molecular coating chosen from the group consisting of monomers, oligomers, or polymers that are primarily organic in origin, capable of forming self-assembled monolayers or self-assembled multilayers, electrically conducting or non-conducting, and contain metal-binding ligands as pendant groups or as part of their backbone.

J. Phys. Chem. B 1997, vol. 101, pp. 2415-2420 considers an electrochemical approach to derivatize atomically flat Si(111) surfaces with aryl adlayers. In particular, what is shown is that the electrochemical reduction of 4-nitro- and 4-bromobenzenediazonium salts in an aqueous acidic HF solution under applied external potential leads to modification of Si(111) surfaces.

Polymer 2003, vol. 44, pp 19-24 teaches that reduced polytetrafluoroethylene (PTFE) can be used to graft nitro and bromo-phenyl diazonium tetrafluoroborate salts in a manner similar to that used for carbon, except that no application of a reductive potential during grafting was required.

Notwithstanding the teachings of the prior art, the problem of making a high-quality molecule-surface interface that provides for a bond of sufficient strength and quality to effect good electronic or photonic interaction between an organic molecule and a surface remains less than completely solved. Moreover, a need remains for a method of making a high-quality molecule-surface interface using a minimum of additional steps, reagents or energy.

SUMMARY

The present invention discloses a method of making a molecule-surface interface comprising at least one surface and at least one organic group adjoined to the surface. The current method comprises contacting at least one organic group precursor with at least one surface wherein the organic group precursor is capable of reacting with the surface in a manner sufficient to adjoin the organic group and the surface.

According to the present invention, the surface defining the molecule-surface interface may be unadulterated or suitably derivatized if desired. Hydride passivation is a preferred surface derivatization according to some embodiments. According to other embodiments, the surface is curved and in the form of particles that are at least about 2 nm in average size.

Suitable materials of the current molecule-surface interface include those materials having a negative open circuit potential that is less than the reduction potential of the organic group precursor. Particularly preferred materials are selected from the group consisting of germanium, tin, boron, carbon, lead, gallium, arsenic, silicon, palladium, platinum, nickel, gold, copper, and any combination thereof. According to some embodiments, the material may be an alloy or a material that is doped with some compound or element. Suitable organic group precursors are preferably capable of reacting with the surface in a manner sufficient to adjoin the organic group and the surface. It is an advantage of the current method that no additional energy, reagents or steps are required to cause the organic group precursor to react with the surface to adjoin the organic group to the surface. In order for the organic group precursor to be capable of reacting with the surface it must have a reduction potential that is greater than the negative open circuit potential (OCP) of the surface. The organic group precursors of the present method are preferably diazonium salts and most preferably aryl diazonium salts depicted in formulas (IV), (V) and (VI):

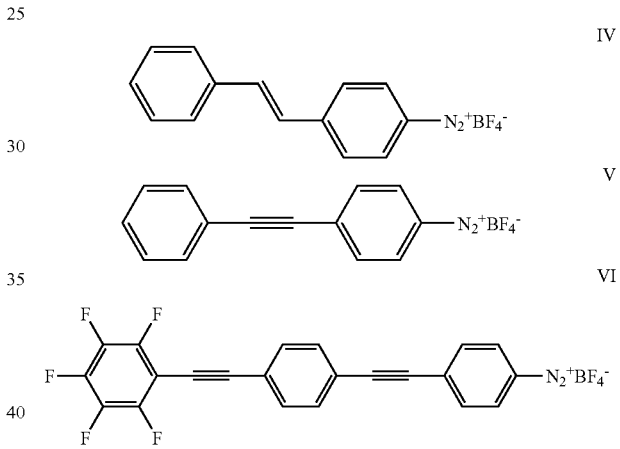

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
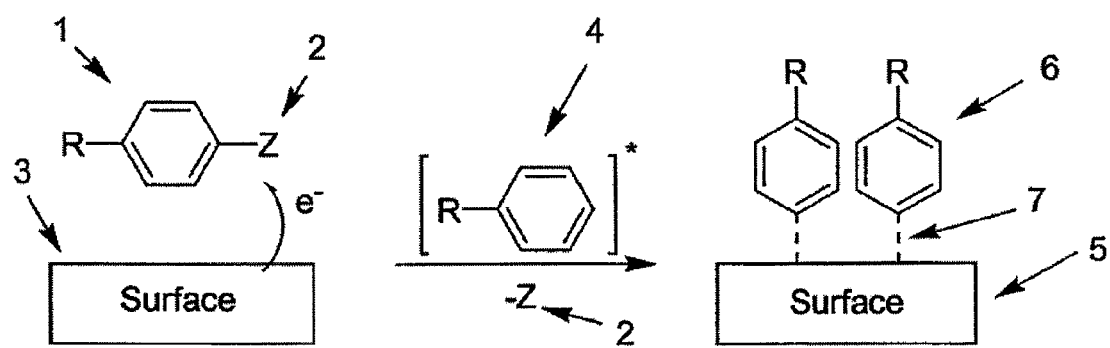
FIG. 1 presents a schematic illustration of a process whereby an organic group becomes adjoined to a reactant surface to provide a product surface.

The present invention comprises a method of making a molecule-surface interface wherein the interface comprises at least one surface comprising at least one material and at least one organic group adjoined to the surface. As used herein, adjoin will have its ordinary meaning; to wit, adjoin means to lie close to or to be in contact with one another. As further used herein, comprise shall mean to consist of in part. The current method comprises contacting at least one organic group precursor with at least one surface wherein the organic group precursor is capable of reacting with the surface in a manner sufficient to adjoin the organic group and the surface.

The surfaces of the current method preferably have those properties usually associated with surfaces used in surface science studies, but smooth surfaces are not essential. Thus, the subject surfaces should be clean, and free of or low in adsorbed contaminants or electrochemically inert oxide layers. Such surfaces are optimally prepared in oxygen-free, water-free environments to provide for clean, oxide-free surfaces. The surfaces will also be substantially smooth. It shall be understood, as it is to those in the art, that a smooth surface will still have a number of inherent defects at the nano-sized and atomic levels, such as, for example, kinks, ledges, terraces and the like. Techniques for preparing suitable subject surfaces may be found, for example, in *Mat. Res. Symp. Proc.* 1997, vol. 477, pp. 299-304, incorporated herein by reference.

According to one embodiment of the present invention, the surface is derivatized. As used herein, a derivatized surface is one that has been treated in such a manner as to have a modified surface composition. That is, the surface is combined with a reagent capable of chemically modifying the surface such that the outermost surface will comprise atoms or chemical groups different from the original surface composition. According to another embodiment, the derivatized surface is preferably a chemically passivated surface. As used herein, a passivated surface is one that has been substituted with some chemical species to mitigate or change the chemical reactivity of the surface. Passivation may, for instance, sufficiently reduce the reactivity of a metastable surface towards oxygen to preclude the formation of an oxide layer on the surface. In particular, according to another embodiment of the present invention, a derivatized surface is a passivated surface that is preferably at least partially hydride-passivated. A hydride-passivated surface shall be defined herein as a surface that is at least partially covered by hydrogen atoms chemically bonded to the surface. Methods of making a hydride-passivated silicon surface are well known in the art; exemplary methods may be found, for example, in *Appl. Phys. Lett.* 1990, vol. 12, pp. 656-658.

The surface of the current invention may have one or a combination of many different shapes. Preferably, the surface of the current invention has a shape that is flat, curved, corrugated, or a combination thereof. According to one embodiment, the surface is curved and in the form of particles that are at least about 2 nm in average diameter; more preferably between about 10 nm and about 250 nm in average diameter. Surfaces according to this embodiment may be known as nanoparticles and there exist methods to make such particles. See, for example, *Chem. Soc. Rev.* 1999, vol. 28 179-185, incorporated herein by reference. The surface may also be corrugated as would result from certain lithographic processes.

Surfaces may generally be characterized by an arrangement of atoms that may differ markedly from the arrangement of atoms in the bulk material beneath the surface. The precise arrangement of surface atoms is chiefly governed by the thermodynamics of the atomic packing; namely, the atomic arrangement that possesses the lowest total energy for the system will often tend to be the arrangement adopted by the surface atoms. Surfaces, though often possessing many defects and eluding complete characterization, are often envisioned as ideal surfaces with a perfectly regular arrangement of surface atoms. One way to describe such arrangements utilizes a vector notation wherein the spacing between atoms within a unit cell is defined by unit vectors. A detailed explanation of this vector notation description, called Miller indices, may be found in any standard reference on the subject, such as, for example, Anthony R. West, "Basic Solid State Chemistry", Wiley Press: New York, 1988, pp. 9-12. There are a nearly infinite number of suitable surface lattice configurations that are acceptable for use in the present invention. The precise surface, as described by the Miller index, will strongly depend on the material employed.

According to the present method, the surface shall comprise at least one material. The material of the present method will have a definite composition. There may be one or a combination of many materials that may have the desirable electronic properties required for use in the present method. In particular, those materials having a negative open circuit potential that is less than the reduction potential of the organic group precursor, as described in detail below, are suitable for use in the present method. However, some materials are more preferred than others. In particular, the material may be selected from the group consisting of transition metals, main group metals, Group IIIB elements, Group IVB elements, Group VB elements, and any combination thereof. By transition metals it shall be understood that these are the d-block metals denoted by Groups IIIA, IVA, VA, VIA, VIIA, VIIIA, IB, and IIIB according to the Previous IUPAC Form of The Periodic Table of the Elements as found in, for instance, the *CRC Handbook of Chemistry of Physics*, $82^{nd}$ Edition, 2001-2002 and used herein as the standard reference for all element group numbers throughout this specification. As used herein, the main group metals shall include the metals of Groups IA, IIA, IIIB, IVB, VB and VIB. Moreover, all elements of Groups IIIB, VB, and IVB, including for example carbon and boron, are included among the preferred materials of the present method. More preferred materials are selected from the group consisting of germanium, tin, boron, carbon, lead, gallium, arsenic, silicon, palladium, platinum, nickel, gold, copper, and any combination thereof; while most preferred materials are selected from the group consisting of silicon, gallium arsenide and palladium. According to one embodiment, a particularly preferred material of the current method is silicon.

The material of the current method may be a pure substance or a mixture of substances. Mixtures of substances can include alloys. However, it will be understood that no material can be absolutely pure and it is expected that the materials of the present method may contain trace contaminants. Indeed, in some embodiments of the current invention, it is desirable to employ mixtures or materials made intentionally impure, i.e. materials containing dopants. Thus, according to one embodiment, the material may be an alloy or a material that is doped with some compound or element, hereinafter referred to as a dopant. Typical dopants are well-known in the art; exemplary dopants include boron, phosphorus, arsenic, antimony, silicon, tellurium, zinc, aluminum, and chromium. At least one or more dopants may be added to the material of the present method to provide a material with desirable electronic properties. In particular, dopants are preferably added to provide materials that behave as semiconductors.

Materials with a broad range of electronic properties may be used in the current method including conductors, insulators, and semiconductors. The semiconductors of the present method may be those derived from the addition of any type of dopant or those not requiring the addition of a dopant. In particular, the semiconductor may be a p-type, n-type or intrinsic semiconductor. An intrinsic semiconductor will be defined herein as one that does not require the presence of a dopant to have the properties of a semiconductor.

The material of the present method may or may not be crystalline. A crystalline material may comprise one and often many single crystals. A single crystal comprises atoms arranged in a regular succession of repeating units, called unit cells, in a common direction and in a common lattice. The unit cell is the same for any one given crystal type. A regular succession of unit cells in a common direction gives rise to a single crystal. A crystalline material may comprise many individual crystals of the same type in different planes. A single material may have many different crystal types accessible to it. Thus, a single material comprising more than one crystal type is known as a polycrystalline material. A material without any detectable crystalline order is amorphous. It shall be understood that some materials may comprise microdomains of crystalline order that appear nearly amorphous according to current methods of crystal characterization, such as, for example X-ray diffraction (XRD). The current method can tolerate a wide range of crystalline or non-crystalline materials. In particular, a crystalline material may or may not be a single crystal. Furthermore, the material may be polycrystalline, nanocrystalline or amorphous.

There are materials according to the current method that are preferable with respect to the combination of crystallinity, dopants, conductivity and composition. According to some embodiments, preferred materials are palladium, gallium arsenide, p-type doped single-crystal silicon, intrinsic single-crystal silicon, n-type doped single-crystal silicon and n-type doped polycrystalline silicon. According to another preferred embodiment of the present invention, the material is silicon with a <100>, <111> or <110> surface. According to yet another preferred embodiment, the material is palladium, gallium arsenide, p-type doped single-crystal silicon, intrinsic single-crystal silicon, n-type doped single-crystal silicon or n-type polycrystalline silicon with a <100>, <111> or <110> flat, hydride-passivated surface.

The present method further comprises contacting at least one organic group precursor with at least one surface. The organic group precursor is preferably capable of reacting with the surface in a manner sufficient to adjoin the organic group and the surface. It is an advantage of the current method that no additional energy, reagents or steps are required to cause the organic group precursor to react with the surface to adjoin the organic group to the surface. In order for the organic group precursor to be capable of reacting with the surface, it must have a reduction potential that is greater than the negative open circuit potential (OCP) of the surface. OCP is defined as the "resting" potential of an electrode in the absence of an applied external potential. Reduction potential is defined as the energy change, expressed in volts (V), accompanying gain of an electron. See for example Xiaoge G. Zhang, "Electrochemistry of Silicon and its Oxides", Kluwer Publishers: New York, 2001, pp. 1-43, incorporated herein by reference. Though not wishing to be bound by any particular theory, it is believed that the organic group precursor can undergo reduction and gain an electron from the surface when the negative open circuit potential is less than the reduction potential of the organic group precursor. According to this non-binding theory, a reactive intermediate is generated by reduction of the organic group precursor that is capable of reacting with the surface. It is believed that in this way the organic group may be adjoined to the surface in the present invention. As depicted in FIG. 1, an exemplary generic organic group precursor 1 comprising extrudable moiety 2 is reduced in the presence of reactant surface 3. Consequently, reactive intermediate 4 adjoins to product surface 5 to give adjoined organic group 6. Organic group 6 is depicted as adjoined to product surface 5 by a dashed line 7. As suggested by dashed line 7, the precise nature of the way in which organic group 6 is adjoined to product surface 5 is not completely known. Organic group 6 may be adjoined in any one of a number of ways including, but not limited to, a covalent bond, an ionic bond or a physisorbed bond. According to one preferred embodiment, the organic group is bonded to the surface via a covalent bond.

According to yet another embodiment of the present method, the organic group is arranged in at least one layer having at least some degree of order. Further according to this embodiment, it is believed that the organic groups may be arranged such that their long axis is between about 90° and about 45° to the surface. Furthermore, it is believed that the organic groups tend to arrange themselves such that the long axes of all the organic groups tend to be roughly parallel to each other. Thus, a layer that is formed is believed to be an ordered layer, although the degree of order will vary depending on the surface and the substrate, and order is not essential for many of the electrical and photonic processes eventually sought. It is also possible according to other embodiments of the current method, to assemble multiple layers upon the surface. Such layers will assemble upon the surface and further layers will tend to assemble upon preceding layers.

It is envisioned that there are many ways in which one could bring the organic group precursor into contact with the surface. For example, the organic group precursor may be in the form of a solution. Alternatively, it is conceivable that the organic group precursor could be brought into contact with the surface as a neat liquid or solid. It is even conceivable that a molecular beam could be used or that the substrate could be evaporated onto the surface by gas phase contact, for example. However, it is preferred according to the present invention to bring the organic group precursor into contact with the surface via a solution of the organic group precursor. Solvents for use in the present invention will be those capable of at least partially dissolving the organic group precursor. Preferred solvents include acetonitrile, methylene chloride, chloroform, ether, sulfolane, and in some cases, water. Acetonitrile is a most preferred solvent.

The organic group precursors of the present method will preferably be a diazonium salt. There exist an almost infinite number of diazonium salts that could be used in the present invention, including known diazonium salts that have been previously synthesized and new diazonium salts that have yet to be synthesized. Some exemplary classes of diazonium salts include alkyl and aryl diazonium salts. It will be appreciated that some diazonium salts will be more stable than others. While it is anticipated that, in theory, any diazonium salt may be used, according to one embodiment those that are stable to the required manipulations are particularly preferred. According to an alternative embodiment, those that are not particularly stable may be generated in situ from compounds that form diazonium salts when subjected to the proper conditions.

According to one embodiment, the diazonium salt is of the general formula (I) wherein $R_1$

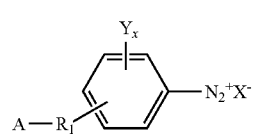

I may be alkyl, alkenyl, aryl, or alkynyl; A may be H, alkyl, alkenyl, aryl, alkynyl or any combination thereof; $Y_x$ may be at least one, and possibly more, substituents from the group consisting of nitro, amino, acyl, heteroatoms, alkyl, alkenyl, aryl, alkynl, fluoro, diazonium, diazo, allyl, thiol, thioacetate, isonitrile, nitrile and H; and X⁻ may be any suitable counterion. In formula (I), it will be understood that the bond between $R_1$ and the aryl ring resides between two carbons of the aryl ring to indicate that $R_1$ may be in any position relative to diazonium moiety $N_2^+X^-$. It shall be further understood that in $R_1$, $Y_x$ and A, each alkyl, aryl, alkenyl and alkynyl group may be further substituted with other groups, such as fluoro, nitro, cyano, and amino. Moreover, alkyl, alkenyl and alkynyl groups are not limited to any particular length. The diazonium moiety of the diazonium salt comprises a latent molecule of $N_2$ and a counterion. Though not wishing to be bound by any particular theory, it is believed that, according to the present invention, the nitrogen of the diazonium salt is extruded as gaseous nitrogen when the reduction potential of the organic group precursor is greater than the negative open circuit potential of the surface and the resulting aryl radical permits for the organic group to be adjoined to the surface. The counterion of the diazonium salt affects the stability of the diazonium salt and is selected based on its ability to form a loose ionic bond with the charged dinitrogen moiety. Preferred counterions include tetrafluoroborate, tetrakis(pentafluorophenyl)-borate, hexafluorophosphate, chloride, bromide, iodide and hydrogensulfate. Tetrafluoroborate is a particularly preferred counterion for the diazonium salts of the current method.

More preferred diazonium salts are those according to general formula (II) wherein $Ar_1$ is

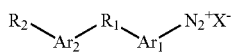

II at least one aryl group wherein the relative substitution pattern of the diazo group $N_2^+X^-$ to $R_1$ may be ortho, meta or para and $Ar_1$ may be further substituted in any other position with at least one substituent selected from the group consisting of nitro, amino, acyl, heteroatoms, alkyl, alkenyl, aryl, alkynyl, fluoro, diazonium, diazo, allyl, thiol, thioacetate, isonitrile, nitrile and H; $R_1$ may be alkyl, alkenyl, aryl, or alkynyl of any further substitution and of any given length; $Ar_2$ is at least one aryl group wherein the relative substitution pattern of $R_2$ to $R_1$ may be ortho, meta or para and $Ar_2$ may be further substituted in any other position with at least one substituent selected from the group consisting of nitro, amino, acyl, heteroatoms, alkyl, alkenyl, aryl, alkynyl, fluoro, diazonium, diazo, allyl, thiol, thioacetate, isonitrile, nitrile and H; and $R_2$ is selected from the group consisting of alkyl, alkenyl, aryl, alkynyl and arylalkynl, of any further substitution and of any given length wherein arylalkynyl, by way of illustration, shall have the general formula (III); wherein $Y_x$ is at least one, and possibly more, substituents selected from

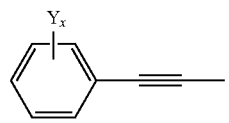

III the group consisting of nitro, amino, acyl, heteroatoms, alkyl, alkenyl, aryl, alkynyl, fluoro, diazonium, diazo, allyl, thiol, thioacetate, isonitrile, nitrile and H.

According to formula (II), it shall be understood that the relative substitution pattern of the diazo group $N_2^+X^-$ to $R_1$ on aryl group $Ar_1$ may be any relative substitution pattern including ortho, meta or para. Similarly, for aryl group $Ar_2$, the relative substitution pattern of $R_1$ and $R_2$ may be ortho, meta or para. Particularly preferred aryl diazonium salts for use in the present invention include those depicted in formulas (IV), (V) and (VI):

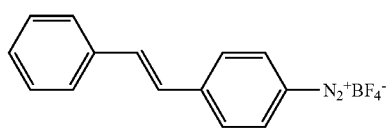

IV

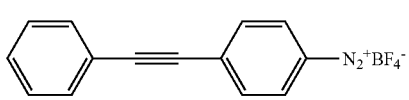

V

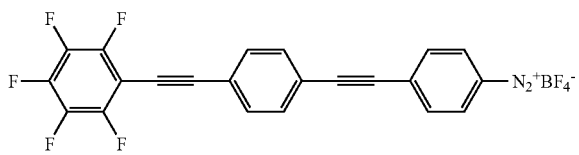

VI

The diazonium salts of the present invention may be used directly as the organic group precursor. However, it is also possible according to an alternative embodiment of the present method to use another chemical species and obtain the organic group precursor in situ by adding, for example, another reagent. For example, it is conceivable that in the case of diazonium salts sufficiently unstable to permit for their isolation or manipulation, aromatic amines, also known as anilines, could be used in conjunction with a reagent such as isoamyl nitrite to provide an organic group precursor diazonium salt in situ.

EXPERIMENTAL EXAMPLES

Reagents and Solvents for Surface Reactions

Acetonitrile (99.5+%) for surface reactions was purchased from Aldrich packed under nitrogen in a SureSeal container. Acetonitrile, $CH_2Cl_2$, ethanol, and water used for rinsing were purchased at HPLC grade and used without further purification. Concentrated ammonium fluoride was purchased at VLSI grade from J. T. Baker. Concentrated hydrochloric acid, concentrated sulfuric acid, 49% hydrofluoric acid, and 30% hydrogen peroxide were purchased at reagent grade. Before use, all diazonium salts were stored under nitrogen in tightly capped vials in the dark at −30° C.

Ellipsometric Measurements

Measurements of surface optical constants and molecular layer thicknesses were taken with a single wavelength (632.8 nm laser) Gaertner Stokes Ellipsometer.

Cyclic Voltammetry (CV) Measurements

Electrochemical characterization was carried out with an Bioanalytical Systems (BAS CV-50W) analyzer. The reference was a saturated calomel electrode (SCE). The counter-electrode was a clean Pt wire. The aqueous redox couple and electrolyte were 0.01 M $Fe(CN)_6^{3/4-}$ in 0.1 M $KClO_4$. Approximately 1 cm² of sample was exposed to solution during CV measurements. The scan rate was 100 mV s⁻¹ from −200 mV to 600 mV.

X-Ray Photoelectron Spectroscopy (XPS) Measurements

A Physical Electronics (PHI 5700) XPS/ESCA system at $5 \times 10^{-9}$ torr was used to take photoelectron spectra. A monochromatic Al X-ray source at 350 W was used with an analytical spot size of 1.2 mm and 45 degree takeoff angle.

FTIR Measurements

A customized analytical system, based on a Mattson Research Series bench, was used, whose basic details are described elsewhere, see Parikh, A. N.; Allara, D. L. *J. Chem. Phys.* 1992, 96, 927, incorporated herein by reference. FTIR spectra were obtained under an extended dry air purge using a liquid $N_2$ cooled wide-band MCT detector. External reflection spectra used 600 scans at 2 $cm^{-1}$ resolution at an 88.5 degree angle of incidence. Transmission spectra used 600 scans at 4 $cm^{-1}$ resolution at normal incidence. A multi-point baseline correction and $H_2O$ and $CO_2$ subtractions in GRAMS/32 are used for qualitative and presentation purposes.

Surface Preparation and Optical Constants

Pd samples were deposited by ion mill sputtering onto a 2-inch undoped oxidized Si wafer at 0.1 Å $s^{-1}$ until a final thickness of 2000 Å was reached. No surface adhesion layer was used. The Pd samples were reacted within 10 minutes after coming out of the vacuum chamber, without any surface cleaning. The n value for the clean Pd surface was 1.9 and k was −4.2. Highly doped 2-inch n-type Si(111) wafers (prime grade, As doped, 0.001-0.005 ohm-cm) were first cleaned for 20 minutes in 2:1 $H_2SO_4/H_2O_2$ "piranha solution" followed by rinsing copiously with water and drying in a stream of $N_2$. The wafer was then hydride-terminated by immersion in $N_2$-sparged concentrated (40%) ammonium fluoride for 15 minutes, rinsed with water, and dried in a stream of $N_2$. The n value for the Si(111):H surface was 3.87 and k was −0.04. Undoped GaAs(100) samples were cut (about 4 $cm^2$) from a 3-inch wafer, sonicated in ethanol for 15 minutes, and $UV/O_3$ cleaned for 15 minutes. The oxidized GaAs shards were then treated with concentrated (37%) HCl for 1 minute, followed by a brief rinse in water, then ethanol, and then a gentle stream of $N_2$. The n value for the clean GaAs surface was 3.85 and k was −0.2. XPS experiments on GaAs used shards from a lightly Te-doped GaAs(100) wafer prepared and characterized with the same protocols.

General Procedure for the Coupling of a Terminal Alkyne with an Aryl Halide Utilizing a Palladium-Copper Cross-Coupling (Castro-Stephens/Sonogashira Protocol)

To an oven-dried screw cap tube or a round bottom flask equipped with a magnetic stir bar were added the aryl halide, bis(triphenylphosphine) palladium(II) dichloride (1-5 mol % based on aryl halide), and copper(I) iodide (1-5 mol % based on aryl halide). The vessel was then sealed with a rubber septum, evacuated and backfilled with nitrogen thrice. Triethylamine or N,N-diisopropylethylamine (Hünig's base) was added followed by THF serving as a co-solvent. After a 5-minute incubation at room temperature, the terminal alkyne was then added and the reaction mixture stirred until complete. External heating up to 80° C. was used for sluggish reactions. The reaction vessel was cooled to room temperature and quenched with water or a saturated solution of $NH_4Cl$. The organic layer was diluted with methylene chloride and washed with a saturated solution of $NH_4Cl$ until the blue color of copper complexes could not be seen in the aqueous phase. The combined aqueous layers were extracted with methylene chloride thrice. The combined organic layers were dried over anhydrous $MgSO_4$ and the solvent removed in vacuo. The crude product was then purified by flash or column chromatography (silica gel). Alternative work-up procedure consisted of solvent removal in vacuo directly followed by chromatography.

General Procedure for the Diazotization of Aromatic Amines with Nitrosonium Tetrafluoroborate in the Acetonitrile-Sulfolane System The nitrosonium salt was weighed out in a nitrogen filled dry box and placed in a round bottom flask equipped with a magnetic stirring bar and sealed with a septum. Acetonitrile and sulfolane were injected in 5 to 1 volume ratio and the resulting suspension was cooled in a dry ice-acetone bath to −40° C. The solution of the aromatic amine was prepared by adding warm sulfolane (45-50° C.) to the amine under a nitrogen blanket, sonication for 1 minute and subsequent addition of acetonitrile (10-20% by volume) and added to the nitrosonium salt suspension over 10 minutes. The reaction mixture was kept at −40° C. for 30 minutes and let warm up to the room temperature. At this point the diazonium salt was precipitated by the addition of ether, collected by filtration, washed with ether and dried. Additional purification of the salt was accomplished by re-precipitation from DMSO by dichloromethane and/or ether.

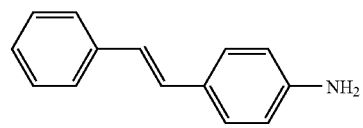

4-Styrylphenylamine

4-Iodoaniline (4.380 g, 20.0 mmol), styrene (2.78 mL, 24.0 mmol), palladium(II) acetate (0.244 g, 1.0 mmol), potassium carbonate (2.488 g, 18.0 mmol), tetrabutylammonium bromide (9.348 g, 29.0 mmol), and DMF (25 mL) were coupled according to the general Heck coupling procedure above for 4 h at 100° C. The crude product was purified via flash column chromatography (3:7 ethyl acetate:hexanes) yielding 2.203 g (56%) of a light brown solid. IR (KBr) 3446.8, 3361.6, 3198.4, 1605.0, 1506.7, 1437.9, 1280.4, 1173.2, 1065.7, 965.8, 814.8, 749.1, 685.7, 525.6, 484.5 $cm^{-1}$. $^1$H NMR (400 MHz, $CDCl_3$) δ7.54-7.52 (m, 2H), 7.41-7.37 (m, 3H), 7.27 (tt, J=7.6, 1.6. Hz, 1H), 7.09 (d, J=16.4 Hz, 1H), 6.98 (d, J=16.4 Hz, 1H), 6.71 (dt, J=8.8, 2.4 Hz, 2H), 3.77 (br s, 2H). $^{13}$C NMR (100 MHz, $CDCl_3$) δ 146.61, 138.40, 129.14, 129.05, 128.44, 128.20, 127.34, 126.56, 125.53, 115.65.

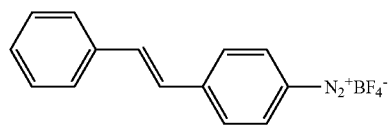

4-Styrylbenzenediazonium Tetrafluoroborate

To a 25 mL round bottom in a drybox was added nitrosonium tetrafluoroborate (0.11 g, 0.95 mmol). Acetonitrile (2 mL) was added and the flask was cooled down to −30° C. A solution of 4-STYRYLPHENYLAMINE (0.17 g, 0.86 mmol) and BHT (0.19 g, 0.86 mmol) in acetonitrile (5 mL) was added dropwise via syringe. The reaction was allowed to warm to −5° C. over 20 min. Ether (10 mL) was then added and the precipitate was filtered. The title compound was purified by re-precipitating from acetonitrile (3 mL) with ether (15 mL) to yield 0.82 g (34%) of the desired compound.

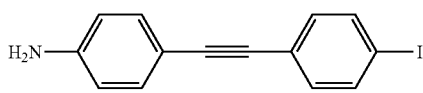

4-(4-Iodophenylethynyl)Aniline 1,4-Diiodobenzene (4.95 g, 1.0 mmol), bis(triphenylphosphine)palladium(II) dichloride (0.07 g, 0.10 mmol), copper (I) iodide (0.019 g, 0.10 mmol), triethylamine (5 mL), THF (10 mL) and 4-ethynylaniline 0.585 g, 5.00 mmol) were used following the general procedure for couplings. For the synthesis of 4-ethynylaniline, please see Tour et al. *Chem. Eur. J.* 2001, vol. 7, pp. 5118-5134 incorporated herein by reference. The tube was capped and stirred room temperature for 12 h. Flash column chromatography ($CH_2Cl_2$—hexanes as eluent) afforded the desired product as light yellow needles (1.13 g, 71% yield). IR (KBr) 3441, 3356, 2210, 1612, 1515, 1281, 1135, 1003, 842, 811, 512 cm$^{-1}$. $^1$H NMR (400 MHz, CDCl$_3$) δ7.650 (m, AA' part of AA'XX' pattern, J=8.7, 2.4, 1.8, 0.7 Hz, 2H), 7.324 (m, XX' part of AA'XX' pattern, J=8.7, 2.4, 1.8, 0.7 Hz, 2H), 7.208 (m, AA' part of AA'XX' pattern, J=8.6, 2.4, 1.8, 0.6 Hz, 2H), 6.630 (m, XX' part of AA'XX' pattern, J=8.6, 2.4, 1.8, 0.6 Hz, 2H), 3.833 (s, 2H). $^{13}$C NMR (100 MHz, CDCl$_3$) δ147.05, 137.60, 133.20, 133.07, 123.67, 114.95, 112.39, 93.45, 91.83, 86.69.

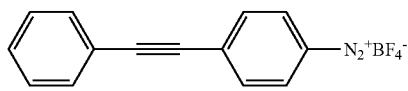

4-Phenylethynylbenzenediazonium Tetrafluoroborate

Following the general diazotization procedure 4-phenylethynylaniline (0.579 g, 3.00 mmol) was treated with NOBF$_4$ (0.368 g, 3.15 mmol) in pure acetonitrile (20 mL). For the synthesis of 4-phenylethynylaniline, please see Kosynkin et al. *Org. Lett.* 2001, vol. 3, pp. 993-995, incorporated herein by reference. Yellow needles of the desired product were precipitated with ether (0.753 g, 86.1% yield). IR (KBr) 3101, 2294, 2217, 1578, 1415, 1033, 1071, 845, 692 cm$^{-1}$. $^1$H NMR (400 MHz, CD$_3$CN) δ8.86 (m, AA' part of AA'XX' pattern, J=8.7, 2.4, 1.7, 0.5 Hz, 2H), 8.16 (m, XX' part of AA'XX' pattern, J=8.7, 2.4, 1.7, 0.5 Hz, 2H), 7.49-7.59 (m, 3H), 7.67-7.71 (m, 2H). $^{13}$C NMR (100 MHz, CD$_3$CN) δ137.15, 134.67, 134.06, 133.13, 131.45, 129.82, 121.96, 114.35, 101.58, 88.21.

2

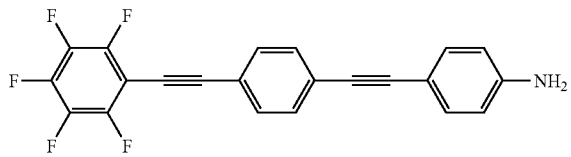

4-(4-Iodophenylethynyl)Aniline (Aniline 2)

(0.319 g, 1.0 mmol), bis(triphenylphosphine)palladium(II) dichloride (0.028 g, 0.04 mmol), copper(I) iodide (0.008 g, 0.04 mmol), triethylamine (2 mL), THF (2 mL) and pentafluorophenylacetylene (0.288 g, 1.50 mmol) were used following the general procedure for couplings. The tube was capped and stirred room temperature for 14 h. Flash column chromatography ($CH_2Cl_2$—hexanes as eluent) afforded the desired product as light yellow needles (0.165 g, 43% yield). IR (KBr) 3442, 3347, 2959, 2163, 2142, 1629, 1552, 1518, 1352, 1332, 1281, 1247, 1166, 838 cm$^{-1}$. $^1$H NMR (400 MHz, CDCl$_3$) δ7.47-7.54 (m, 4H), 7.343 (m, XX' part of AA'XX' pattern, J=8.7, 2.5, 1.8, 0.6 Hz, 2H), 6.640 (m, XX' part of AA'XX' pattern, J=8.7, 2.5, 1.8, 0.6 Hz, 2H), 3.859 (s, 2H). $^{13}$C NMR (100 MHz, CDCl$_3$) δ 147.23, 133.32, 131.97, 131.88, 131.52, 125.60, 120.58, 114.93, 112.22, 93.30, 87.18, 74.66. $^{19}$F NMR (470.5 MHz, THF-d$_8$) δ −134.73-134.80 (m, 2F), −151.38 (tt, J=21, 3 Hz, 1F), −160.51-160.62 (m, 2F).

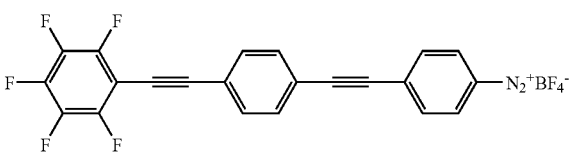

VI

Diazonium Salt VI

Following the general diazotization procedure, ANILINE 2 (0.153 g, 0.040 mmol) was treated with NOBF$_4$ (0.052 g, 0.52 mmol) in acetonitrile (4 mL) and sulfolane (4 mL). The precipitation of the product was effected by the addition of ether (150 mL). The salt was washed with ether and dried in vacuo (0.124 g, 64% yield). IR (KBr) 3106, 2275, 2214, 1576, 1526, 1502, 1078, 989, 854, 832 cm$^{-1}$. $^1$H NMR (400 MHz, DMSO-d$_6$) δ8.71-8.74 (m, 2H), 8.15-8.17 (m, 2H), 7.74-7.79 (m, 4H). $^{13}$C NMR (100 MHz, DMSO-d$_6$) δ 133.87, 133.63, 133.09, 132.64, 132.25, 122.11, 114.93, 100.15, 98.31, 89.83, 75.57. $^{19}$F NMR (470.5 MHz, CD$_3$CN) δ−136.86-136.92 (m, 2F), −150.42 ($^{10}$BF$_4$), −150.47 ($^{11}$BF$_4$), −152.72 (tt, J=21, 3 Hz, 1F), −162.37=162.48 (m, 2F).

Reactions of Surfaces with Diazonium Salts

The cleaned, prepared surface materials were brought inside a low-oxygen N$_2$-atmosphere glove box. Inside the glove box, a solution of the diazonium salt was made to 0.5 mM concentration in acetonitrile, providing enough volume to completely cover the entire sample inside a screw-cap Nalgene jar. To adequately cover a 2-inch wafer, at least 10 mL must be prepared. For the smaller shards of GaAs, 5 mL of solution is sufficient. The surface samples are immersed in the diazonium solution, sealed to prevent evaporation, and covered with foil to prevent light exposure. The reaction time was 2 hours, although shorter reaction times may be possible. Reaction times longer than 6 hours tended to create multilayers up to 3.5-5 nm thick, depending on the molecule that was used (layer thicknesses were determined by ellipsometry). At the end of the reaction, the samples were brought out of the glove box, rinsed with acetonitrile and soaked for 5 minutes (to remove residual diazonium salt), and then rinsed with $CH_2Cl_2$ (to remove physisorbed hydrocarbons) and soaked for 1 minute. The samples were removed from the $CH_2Cl_2$ and then dried thoroughly with N$_2$.

What is claimed is:

1. A method for making a molecule-surface interface, said method comprising:
    a) providing at least one silicon surface;
       wherein the at least one silicon surface comprises a doping state and a silicon form; and wherein the at least one silicon surface is at least partially hydride-passivated;
b) generating at least one diazonium salt as an organic group precursor;
c) contacting the at least one diazonium salt with the at least one silicon surface; and
d) reacting the at least one diazonium salt with the at least one silicon surface in at least one solvent in the absence of an externally applied potential to covalently bond a plurality of organic groups to the at least one silicon surface;
wherein the plurality of organic groups comprise at least one layer on the at least one silicon surface.

2. The method of claim 1, wherein the doping state comprises undoped intrinsic silicon.

3. The method of claim 2, wherein the silicon form is selected from the group consisting of single-crystal silicon, polycrystalline silicon, nanocrystalline silicon, and amorphous silicon.

4. The method of claim 3, wherein the single-crystal silicon has a Miller index selected from the group consisting of <100>, <111> and <110>.

5. The method of claim 1, wherein the doping state comprises at least one dopant comprising the at least one silicon surface.

6. The method of claim 5, wherein the at least one dopant is selected from the group consisting of boron, phosphorus, arsenic, antimony, tellurium, zinc, aluminum, chromium and combinations thereof.

7. The method of claim 5, wherein the doping state and the silicon form comprise a silicon source selected from the group consisting of p-type doped single-crystal silicon, n-type doped single-crystal silicon, p-type doped polycrystalline silicon, n-type doped polycrystalline silicon, n-type doped nanocrystalline silicon, p-type doped nanocrystalline silicon, n-type doped amorphous silicon and p-type doped amorphous silicon.

8. The method of claim 7, wherein the p-type doped single-crystal silicon, n-type doped single-crystal silicon, p-type doped polycrystalline silicon and n-type doped polycrystalline silicon each have a Miller index selected from the group consisting of <100>, <111> and <110>.

9. The method of claim 1, wherein the at least one solvent is selected from the group consisting of acetonitrile, methylene chloride, chloroform, ether, sulfolane, water and combinations thereof.

10. The method of claim 1, wherein the at least one diazonium salt comprises at least one aryl diazonium salt.

11. The method of claim 10, wherein the at least one aryl diazonium salt has structure of

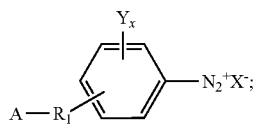

wherein $R_1$ is selected from the group consisting of alkyl, alkenyl, aryl, and alkynyl;
wherein A is selected from the group consisting of H, alkyl, alkenyl, aryl, alkynyl and combinations thereof;
wherein $Y_x$ comprises at least one substituent selected from the group consisting of nitro, amino, acyl, heteroatoms, alkyl, alkenyl, aryl, alkynyl, fluoro, diazonium, diazo, allyl, thiol, thioacetate, isonitrile, nitrile and H; and
wherein $X^-$ is selected from the group consisting of tetrafluoroborate, tetrakis(pentafluorophenyl)borate, hexafluorophosphate, chloride, bromide, iodide and hydrogensulfate ($HSO_4^-$).

12. The method of claim 11, wherein A comprises an aryl group further substituted with at least one substituent selected from the group consisting of nitro, amino, acyl, heteroatoms, alkyl, alkenyl, aryl, alkynyl, fluoro, diazonium, diazo, allyl, thiol, thioacetate, isonitrile, nitrile and H.

13. The method of claim 11, wherein the at least one aryl diazonium salt has a structure selected from the group consisting of

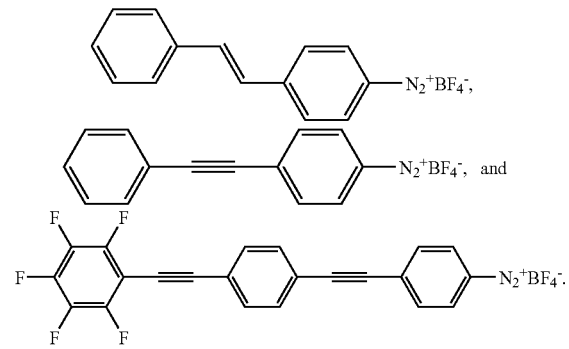

14. The method of claim 1, wherein the generating step comprises pre-forming the at least one diazonium salt.

15. The method of claim 1, wherein the generating step comprises an in situ formation of the at least one diazonium salt.

16. The method of claim 15, wherein the in situ formation comprises adding at least one reagent to an aromatic amine to form an aryl diazonium salt.

17. The method of claim 16, wherein the at least one reagent comprises isoamyl nitrite.

18. The method of claim 1, wherein the plurality of organic groups comprise an ordered monolayer.

19. The method of claim 18, wherein a long axis of each of the plurality of organic groups makes an angle to the at least one silicon surface between about 90° and about 45°.

20. The method of claim 1, wherein the plurality of organic groups comprise a multilayer.

21. The method of claim 1, wherein the at least one silicon surface comprises a shape selected from the group consisting of flat, curved, corrugated, and combinations thereof.

* * * * *